US012717250B2

(12) United States Patent
Mueller

(10) Patent No.: US 12,717,250 B2
(45) Date of Patent: Aug. 25, 2026

(54) ACTIVE LINEAR MOTOR PARASITIC FORCE COMPENSATION

(71) Applicant: Applied Materials, Inc., Santa Clara, CA (US)

(72) Inventor: Ulrich Mueller, Berkeley, CA (US)

(73) Assignee: Applied Materials, Inc., Santa Clara, CA (US)

(*) Notice: Subject to any disclaimer, the term of this patent is extended or adjusted under 35 U.S.C. 154(b) by 62 days.

(21) Appl. No.: 18/255,954

(22) PCT Filed: Dec. 30, 2021

(86) PCT No.: PCT/US2021/065647

§ 371 (c)(1),
(2) Date: Jun. 5, 2023

(87) PCT Pub. No.: WO2022/150221

PCT Pub. Date: Jul. 14, 2022

(65) Prior Publication Data

US 2024/0045345 A1 Feb. 8, 2024

Related U.S. Application Data

(60) Provisional application No. 63/135,175, filed on Jan. 8, 2021.

(51) Int. Cl.
*G03F 7/00* (2006.01)

(52) U.S. Cl.
CPC ...... *G03F 7/70758* (2013.01); *G03F 7/70725* (2013.01); *G03F 7/70775* (2013.01)

(58) Field of Classification Search
CPC ............ G03F 7/70758; G03F 7/70725; G03F 7/70775; G03F 7/2051; G03F 7/70;
(Continued)

(56) References Cited

U.S. PATENT DOCUMENTS 6,322,060 B1 * 11/2001 Mayama ................ F16F 15/02 267/136
2001/0030522 A1 10/2001 Lee
(Continued)

FOREIGN PATENT DOCUMENTS

CN 103676488 A 3/2014
JP 2004165416 A * 6/2004
TW 200305798 A 11/2003

OTHER PUBLICATIONS

English translation of JP2004165416, published Jun. 10, 2004. (Year: 2004).*

(Continued)

*Primary Examiner* — Christina A Riddle
(74) *Attorney, Agent, or Firm* — Patterson + Sheridan, LLP

(57) ABSTRACT

Embodiments of the present disclosure relate to a linear motor system and a digital lithography system having the linear motor system that compensates for potential parasitic forces applied to at least one stage of the digital lithography system during operation. The digital lithography system includes one or more motor coils disposed between an upper plate and a lower plate of a yoke of at least one track. The motor coils are each coupled to a mount which is coupled to a stage. Each mount includes one or more active compensators. During a digital lithography operation, the active compensators are in communication with the controller, The active compensators provides a force in the opposite direction of the parasitic forces, such as vibrations and other disturbances. The compensation of the parasitic forces increases the quality of the patterns printed by the digital lithography system.

17 Claims, 5 Drawing Sheets

(58) Field of Classification Search
CPC ..... G03F 7/70691–70791; G03F 7/708; G03F 7/70808; G03F 7/70816; G03F 7/70825; G03F 7/70833; G03F 7/70841; G03F 7/7085; G03F 7/70858; G03F 7/709; G03F 7/70975; G03F 7/70991; G03F 7/70716; G03F 7/70291; G03F 7/70016; G03F 7/70275; G03F 7/703; G03F 7/70458; G03F 7/70508; G03F 7/7065; G03F 7/707; G03F 7/70766; G03F 9/7003; H02K 41/031; F16F 15/002; F16F 15/02; F16F 7/1011; H01J 37/20; H01L 21/68; H01L 21/682; Y10T 74/20207
USPC ................ 355/18, 30, 52–55, 67–77; 310/51
See application file for complete search history.

(56) References Cited

U.S. PATENT DOCUMENTS

2001/0040324 A1 11/2001 Mayama et al.
2005/0168076 A1 8/2005 Hazelton
2006/0119026 A1* 6/2006 Ryaboy .................... B60N 2/54 267/140.15
2010/0155560 A1* 6/2010 Makino ................ H02K 41/031 248/346.01
2013/0328253 A1* 12/2013 Kraner .................. F16F 15/022 267/140.14
2017/0090303 A1 3/2017 Johnston et al.
2019/0235389 A1 8/2019 Lai et al.
2020/0333711 A1 10/2020 Chen et al.

OTHER PUBLICATIONS

International Search Report/ Written Opinion issued to PCT/US2021/065647 on Apr. 22, 2022.
Taiwanese Office Action for Application No. 110149303 mailed Jun. 27, 2025.
Taiwanese Office Action for Application No. 110149303 dated Feb. 25, 2026.

* cited by examiner

ACTIVE LINEAR MOTOR PARASITIC FORCE COMPENSATION

BACKGROUND

Field

Embodiments of the present disclosure generally relate to lithography systems. More particularly, embodiments of the present disclosure relate to digital lithography systems that compensate for vibrations during a digital lithography operation.

Description of the Related Art

Photolithography is widely used in the manufacturing of semiconductor devices, such as for back-end processing of semiconductor devices, and display devices, such as liquid crystal displays (LCDs). For example, large area substrates are often utilized in the manufacture of LCDs. LCDs, or flat panel displays, are commonly used for active matrix displays, such as computers, touch panel devices, personal digital assistants (PDAs), cell phones, television monitors, and the like. Generally, flat panel displays include a layer of liquid crystal material as a phase change material at each pixel, sandwiched between two plates. When power from a power supply is applied across or through the liquid crystal material, an amount of light passing through the liquid crystal material is controlled, i.e., selectively modulated, at the pixel locations enabling images to be generated on the display.

A conventional digital lithography system utilizes linear motors to move a stage when printing patterns. During operation of a lithography system, movements of the stage results in motor generated parasitic forces such as vibrations and other disturbances. It is difficult to compensate for the parasitic forces acting perpendicular to the motion directions of the stage and the linear motors. These parasitic forces can lead to mura or other undesirable effects in the mask pattern.

Accordingly, what is needed in the art is a linear motor system and a digital lithography system having the linear motor system.

SUMMARY

In one embodiment, a digital lithography system is provided. The system includes one or more tracks disposed on a slab. Each of the one or more tracks have a yoke. The yoke includes a lower plate coupled to the slab and an upper plate. The system further includes one or more motor coils. Each of the motor coils are disposed between the lower plate and the upper plate. The system further includes one or more mounts having one or more active compensators of vibrations during operation of the digital lithography system. Each of the mounts are coupled to a respective motor coil of the one or more motor coils. The system further includes a stage coupled to each of the one or more mounts.

In another embodiment, a digital lithography system is provided. The system includes a slab. The system further includes a stage disposed over the slab. The stage is configured to support a substrate. The system further includes one or more tracks disposed on the slab. The stage is configured to move along the one or more tracks. Each of the one or more tracks have a yoke. The yoke includes a lower plate coupled to the slab and an upper plate. The system further includes one or more motor coils. Each of the motor coils are disposed between the lower plate and the upper plate. The system further includes one or more mounts having one or more active compensators of vibrations during operation of the digital lithography system. Each of the mounts are coupled to a respective motor coil of the one or more motor coils. The stage is coupled to each of the one or more mounts.

In yet another embodiment, a method of using a digital lithography system is provided. The method includes moving a stage along one or more tracks. The stage is coupled to one or more mounts. Each mount of the one or more mounts have one or more active compensators. Each mount of the one or more mounts is coupled to a respective motor coil of one or more motor coils disposed between an upper plate and a lower plate of the one or more tracks. The upper plate and the lower plate have an array of magnets disposed on an inner surface thereof. The method further includes measuring vibrations from the motor coils during operation of the digital lithography system with an accelerometer disposed in each active compensator of the one or more active compensators. The method further includes actuating a moving mass disposed in each active compensator of the one or more active compensators in a direction opposite of the vibrations from the motor coils.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments described herein provide a linear motor system and a digital lithography system having the linear motor system that compensates for potential parasitic forces applied to at least one stage of the digital lithography system during operation. In one embodiment, a system is provided. The system includes one or more tracks disposed on a slab. Each of the one or more tracks have a yoke. The yoke includes a lower plate coupled to the slab and an upper plate. The system further includes one or more motor coils. Each of the motor coils are disposed between the lower plate and the upper plate. The system further includes one or more mounts having one or more active compensators. Each of the mounts are coupled to a respective motor coil of the one or more motor coils. The system further includes a stage coupled to each of the one or more mounts.

Figure 1:
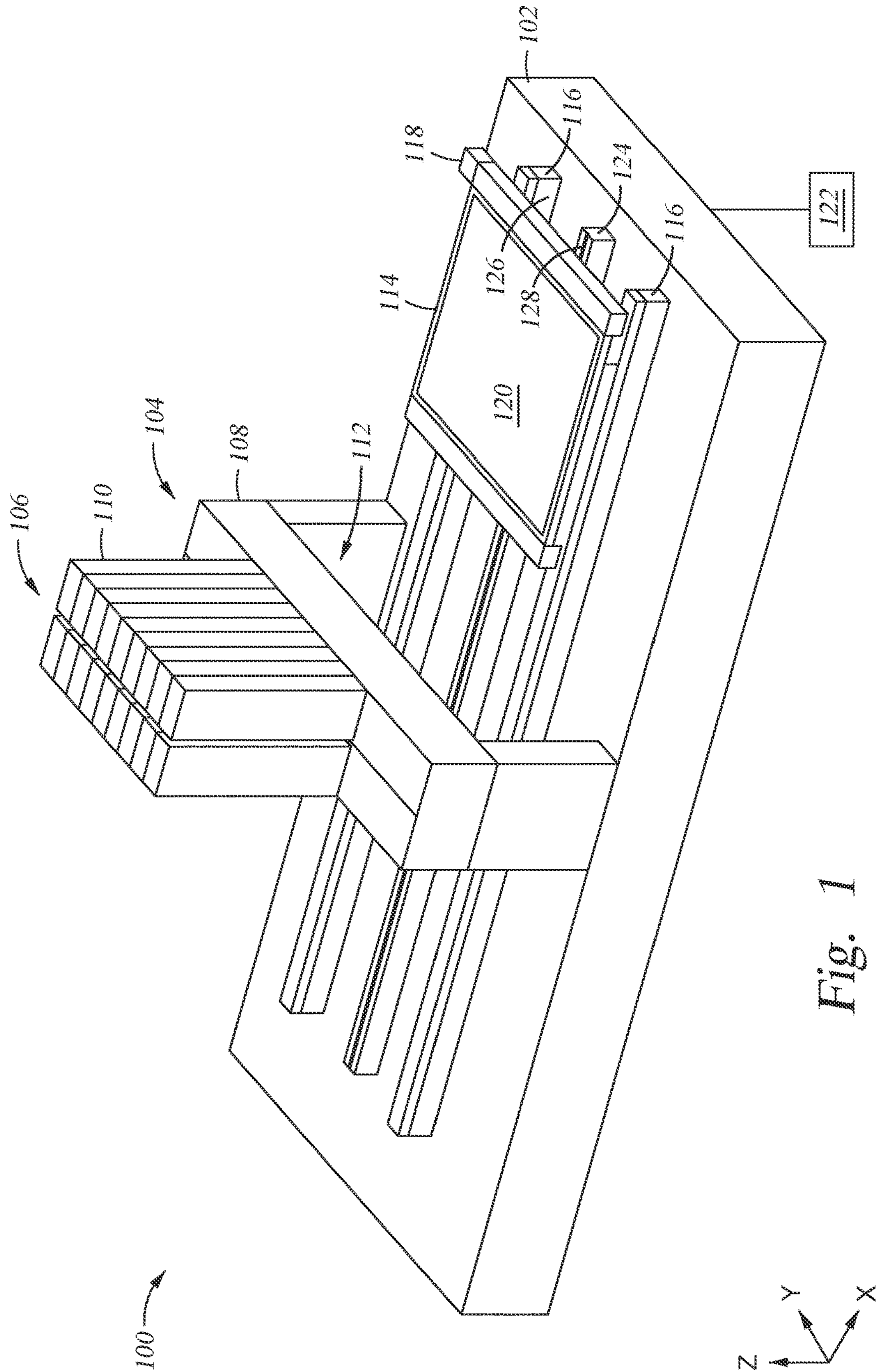
FIG. 1 is a perspective view of a digital lithography system according to embodiments.

FIG. 1 is a perspective view of a digital lithography system 100. The digital lithography system 100 includes at least one stage 114 and a processing apparatus 104. While one stage 114 is depicted in FIG. 1, the digital lithography system 100 may include two or more stages 114. The stage 114 is supported by one or more tracks 116 disposed on a slab 102. A substrate 120 is supported by the stage 114. The stage 114 moves along the one or more tracks 116 in the X direction as indicated by the coordinate system shown in FIG. 1. The stage 114 can also move in the Y direction for processing and/or indexing the substrate 120. The stage 114 is capable of independent operation and can scan the substrate 120 in one direction and step in the other direction. An encoder 118 is coupled to the stage 114 in order to provide information of the location of the stage 114 to a controller 122.

An air bearing 124 is coupled to the slab 102. The air bearing 124 is positioned adjacent an inner wall 126 of each track 116 of the one or more tracks 116. The air bearing 124 facilitates the movement of the stage 114. In one embodiment, which can be combined with other embodiments described herein, a position sensor 128 is disposed along a surface of the air bearing 124. The position sensor 128 detects the position of the stage 114. The position sensor 128 can communicate with the encoder 118 and the controller 122 to provide information of the location of the stage 114 to the controller 122. In one embodiment, which can be combined with other embodiments described herein, the position sensor 128 measures the velocity of the stage 114.

Figure 2A:
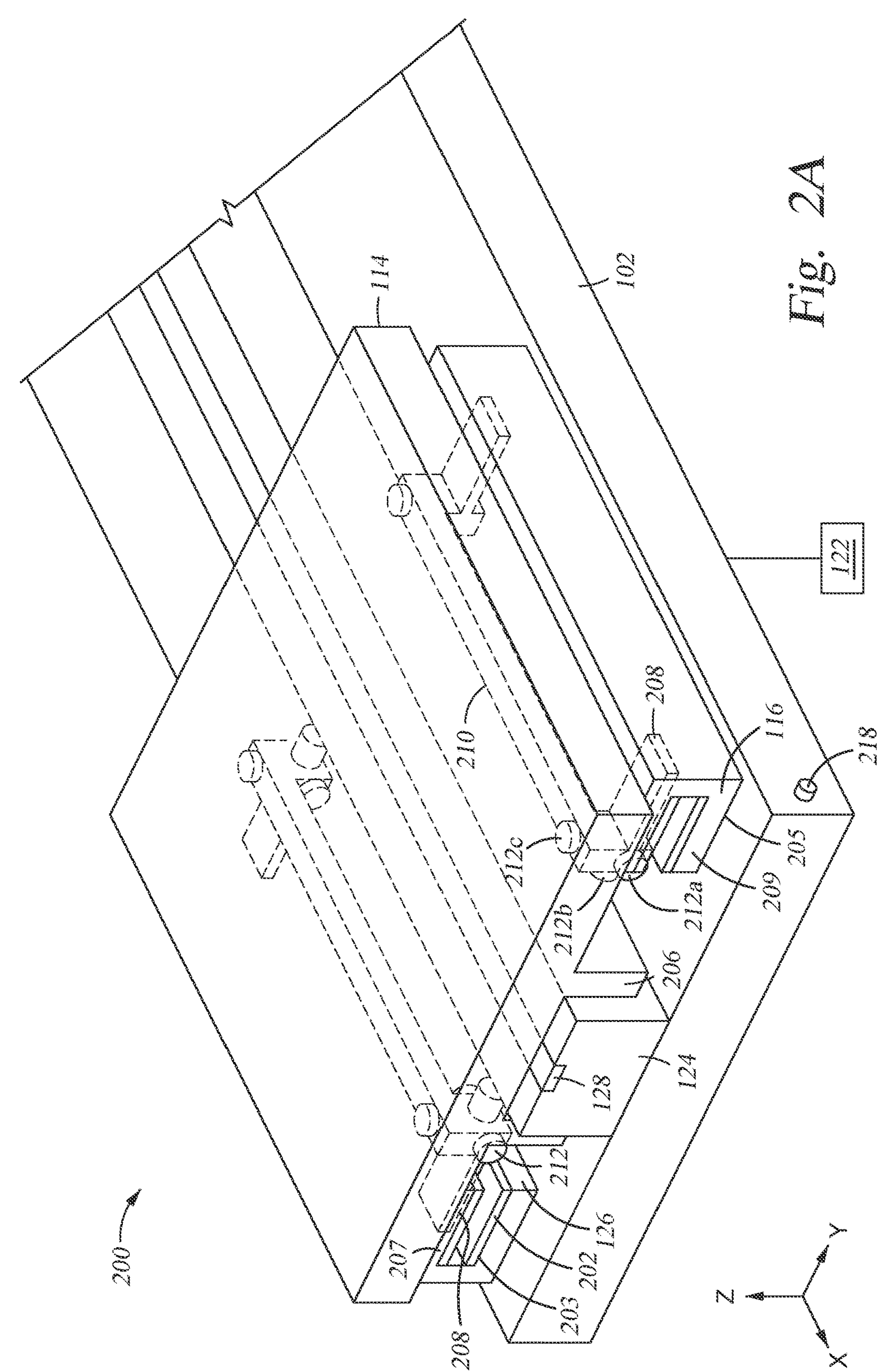
FIG. 2A is a schematic, perspective view of a linear motor system of a digital lithography system according to embodiments.
Figure 2B:
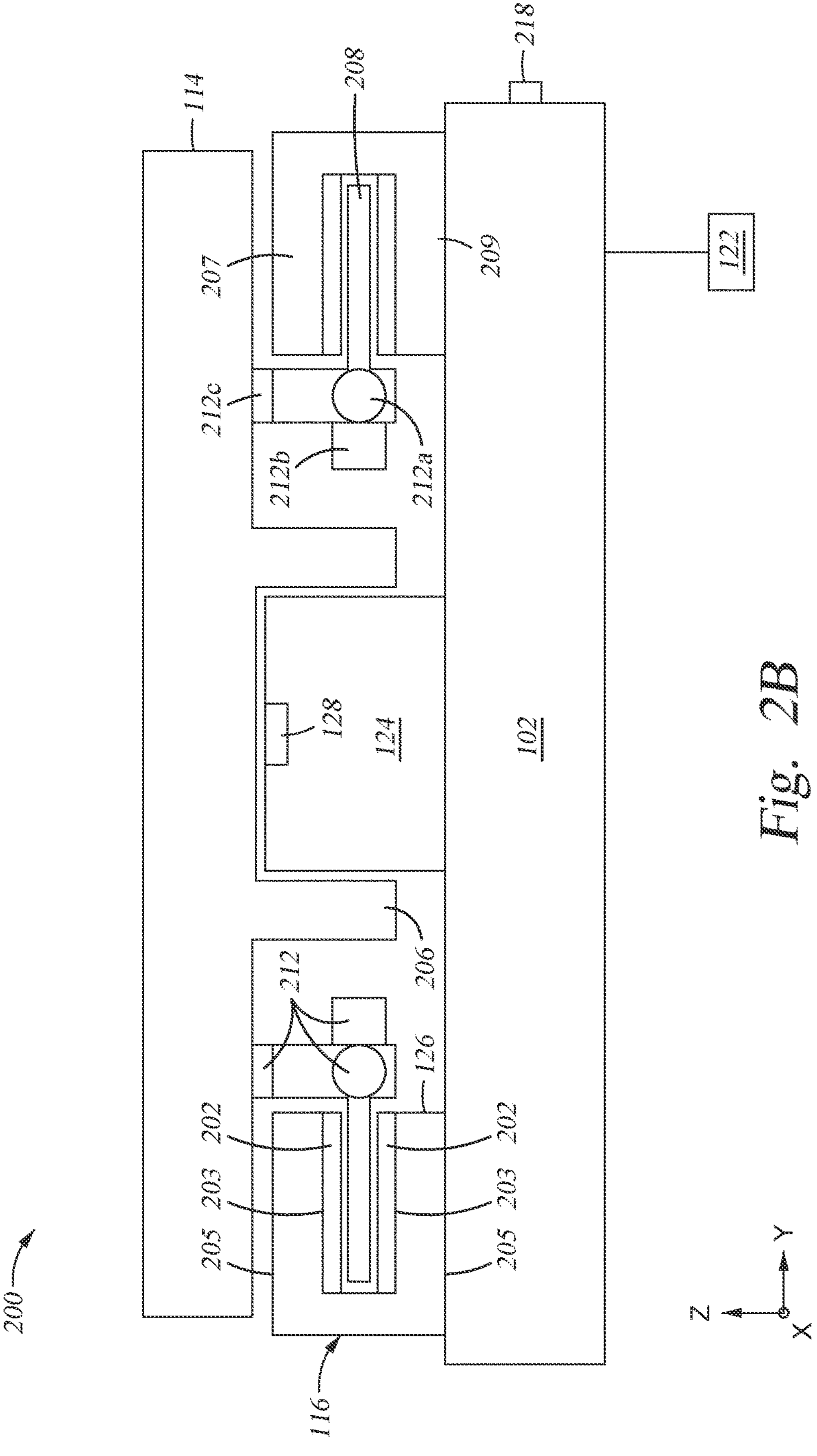
FIG. 2B is a schematic, side view of a linear motor system of a digital lithography system according to embodiments.
Figure 2C:
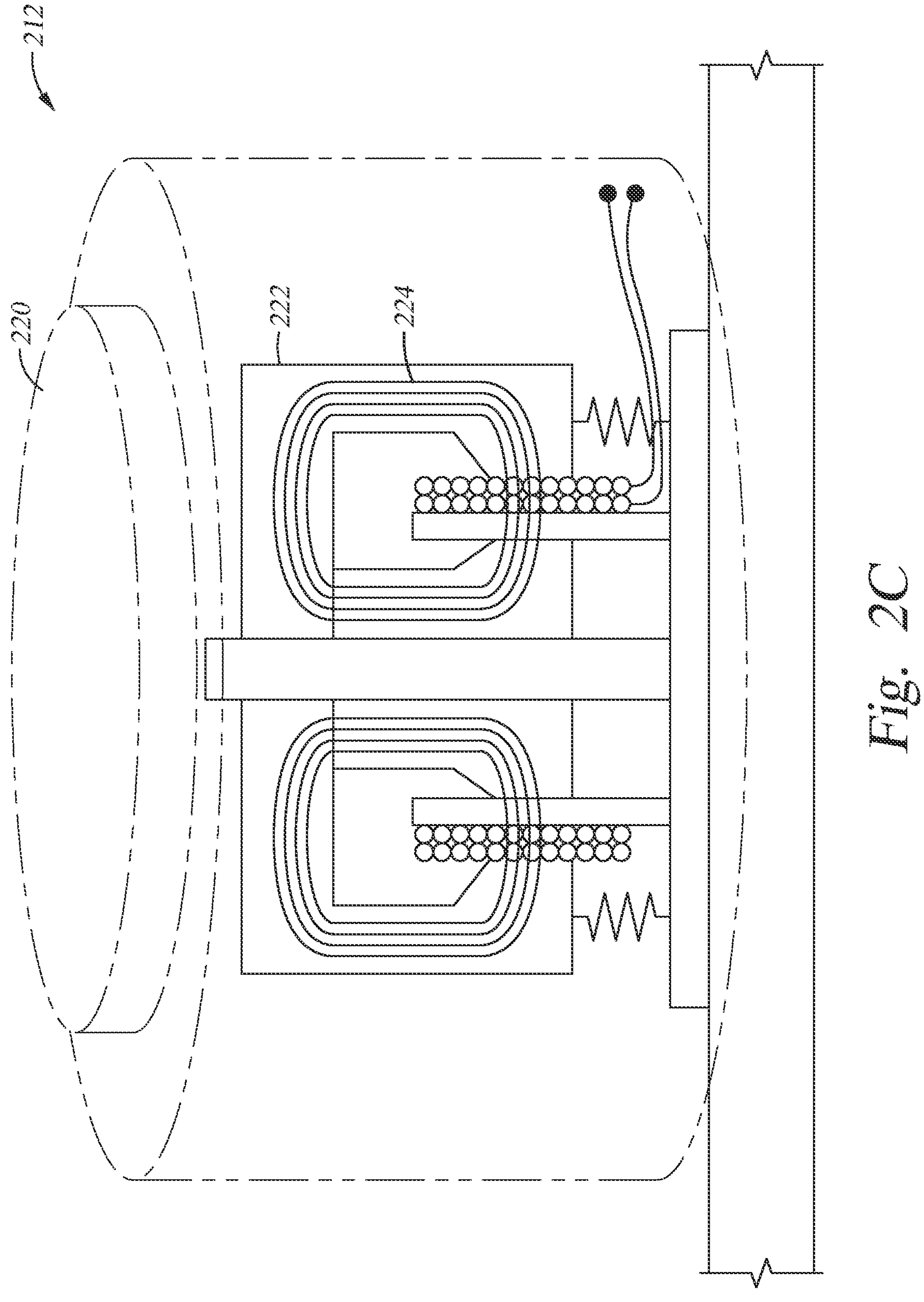
FIG. 2C is a schematic, side view of an active compensator according to embodiments.

The controller 122 is generally designed to facilitate the control and automation of the processing techniques and the compensation techniques described herein. The controller 122 may be coupled to or in communication with the processing apparatus 104, the stage 114, the position sensor 128, a plurality of active compensators 212 (as shown in FIGS. 2A-2C), a base accelerometer 218 (as shown in FIGS. 2A and 2B), and the encoder 118. The processing apparatus 104 and the encoder 118 may provide information to the controller 122 regarding the substrate processing and the substrate aligning. For example, the processing apparatus 104 may provide information to the controller 122 to alert the controller 122 that substrate processing has been completed. A program (or computer instructions), which may be referred to as an imaging program, readable by the controller 122, determines which tasks are performable on a substrate. The program includes a mask pattern data and code to monitor and control the processing time and substrate position. The mask pattern data corresponds to a pattern to be written into the photoresist using the electromagnetic radiation.

The processing apparatus 104 includes a support 108 and a processing unit 106. The processing apparatus 104 straddles the one or more tracks 116 and is disposed on the slab 102, and thereby includes an opening 112 for the one or more tracks 116 and the stage 114 to pass under the processing unit 106. The processing unit 106 is supported over the slab 102 by a support 108. The processing unit 106 includes a plurality of image projection systems. In one embodiment, the processing unit 106 contains as many as 84 image projection systems. Each image projection system is disposed in a case 110. During a digital lithography operation, the stage 114 moves in the X direction from a loading position, as shown in FIG. 1, to a processing position. The processing position is one or more positions under the processing unit 106. The trajectory of the stage 114 from the loading position to the processing position is input to the controller 122 prior to the digital lithography operation.

FIG. 2A is a schematic, perspective view of a linear motor system 200 of a digital lithography system 100. FIG. 2B is a schematic, cross-section view of a linear motor system 200 of a digital lithography system 100. As shown in FIGS. 2A and 2B, the slab 102 includes one or more tracks 116 supporting at least one stage 114. An air bearing 124 is coupled to the slab 102. The air bearing 124 is positioned adjacent an inner wall 126 of each track 116 of the one or more tracks 116. In one embodiment, which can be combined with other embodiments described herein, the stage 114 includes a pair of protrusions 206. The pair of protrusions 206 are disposed adjacent to the air bearing 124 to assist the stage 114 to move along the air bearing 124. A position sensor 128 is disposed on a surface of the air bearing 124. The position sensor 128 communicates the position of the stage 114 to the controller 122. In one embodiment, which can be combined with other embodiments described herein, the stage 114 is an XY stage, i.e., the stage 114 is operable to move in the X direction and the Y direction. In another embodiment, which can be combined with other embodiments described herein, the stage 114 is an XYZ stage, i.e., stage 114 is operable to move in the X direction, the Y direction, and the Z direction.

Each of the one or more tracks 116 includes a yoke 205. The yoke 205 includes a lower plate 209 and an upper plate 207. The lower plate 209 is coupled to the slab 102. The lower plate 209 and the upper plate 207 each include an array of magnets 202 coupled to an inner surface 203 of the lower plate 209 and the upper plate 207. In one embodiment, which can be combined with other embodiments described herein, the yoke 205 is a metallic material. For example, the yoke 205 is steel. Each track 116 includes one or more motor coils 208 disposed between the lower plate 209 and the upper plate 207 of the yoke 205. In one embodiment, which can be combined with other embodiments described herein, the one or more motor coils 208 are casted from an epoxy resin. The one or more motor coils 208 are able to move linearly along the array of magnets 202. The one or more motor coils 208 move due to the magnetic force generated by the array of magnets 202 of the lower plate 209 and the upper plate 207 of the yoke 205.

During a digital lithography operation utilizing the digital lithography system 100, the one or more motor coils 208 move along the array of magnets 202. Each motor coil 208 generates parasitic forces, such as vibrations and other disturbances, which propagate throughout the digital lithography system 100. The vibrations can result in mura and edge roughness when printing patterns. Compensating for the parasitic forces that propagate in the direction perpendicular to the motion direction of the one or more motor coils 208 can improve the quality of the patterns. To compensate for the parasitic forces in the digital lithography system 100, the one or more motor coils 208 are each coupled to a mount 210 with a plurality of active compensators 212 coupled to each mount 210.

The one or more mounts 210 are further coupled to the stage 114. The one or more motor coils 208 move along the array of magnets 202 and the stage 114 coupled to the one or more mounts 210 will also move. The one or more mounts 210 each include the plurality of active compensators 212 disposed thereon. In some embodiments, the stage 114 may be coupled to one of the plurality of active compensators 212. Although three active compensators 212 are shown on the mount 210 in FIGS. 2A and 2B, the mount 210 is not limited to three active compensators 212. Each active compensator of the plurality of active compensators 212 are operable to compensate for vibrations in a direction. For example, a first active compensator 212*a* compensates for the vibrations in the X direction, a second active compensator 212*b* compensates for the vibrations in the Y direction, and a third active compensator 212*c* compensates for the vibrations in the Z direction.

The slab 102 includes a base accelerometer 218. The base accelerometer 218 is coupled to the slab 102. The base accelerometer 218 measures the acceleration of the slab 102. For example, the base accelerometer 218 can detect and measure shifts of the slab 102, and thus the entire digital lithography system 100. The base accelerometer 218 is in communication with the controller 122. The base accelerometer 218 can communicate the measurements to the controller 122.

Although four motor coils 208 are shown in FIG. 2A, each track 116 of the one or more tracks 116 may retain one or more motor coils 208. Each motor coil 208 of the one or more motor coils 208 includes the plurality of active compensators 212 coupled to the respective mount 210 of the one or more mounts 210. In one embodiment, which can be combined with other embodiments described herein, the one or more tracks 116 each include at least two motor coils 208. In another embodiment, which can be combined with other embodiments described herein, the one or more tracks 116 each include one motor coil 208. In yet another embodiment, which can be combined with other embodiments described herein, one track 116 is disposed on the slab 102 to support the stage 114.

FIG. 2C is a schematic, side-view of an active compensator 212. The active compensator 212 includes an accelerometer 220, a moving mass 222, and a voice coil 224. The active compensator 212 is coupled to one of the one or more mounts 210. In one embodiment, which can be combined with other embodiments described herein, one or more of the active compensators 212 can be coupled to each mount 210 of the one or more mounts 210. Each of the one or more active compensators 212 are in communication with the controller 122.

The accelerometer 220 is disposed in the active compensator 212. The accelerometer 220 is a sensor operable to detect the acceleration of the motor coil 208 as it moves along the one or more tracks 116. In one embodiment, which can be combined with other embodiments described herein, the accelerometer 220 is in communication with the controller 122 to communicate the acceleration of the motor coil 208 to the controller 122. Depending on the location of the active compensator 212, the accelerometer 220 can measure the acceleration of the motor coil 208 in the X direction, the Y direction, and the Z direction.

The active compensator 212 includes the moving mass 222 to generate a force. The moving mass 222 can generate a force in the opposite direction of the vibrations and other disturbances. For example, the moving mass 222, based on the measurements from the accelerometer 220, will generate a force and accelerate in the opposite direction of the vibration or other disturbances to cancel out the vibration or other disturbance. In one embodiment, which can be combined with other embodiments described herein, multiple active compensators 212 can be used to compensate for vibrations and other disturbances in multiple directions. For example, one or more active compensators 212 can be positioned to compensate for vibrations in the X direction, the Y direction, and the Z direction, as indicated by the coordinate system shown in FIGS. 2A and 2B.

Additionally, the position sensor 128 disposed along a surface of the air bearing 124 transfers the position of the one or more motor coils 208 and the stage 114 to the controller 122. In combination, the acceleration of the one or more motor coils 208, the position of the one or more motor coils 208, and the trajectory of the stage 114 are communicated to the controller 122. The controller 122 is in communication with the voice coil 224. The controller 122 receives the acceleration of the one or more motor coils 208, the position of the one or more motor coils 208, and the trajectory of the stage 114, and communicates with the voice coil 224. The voice coil 224 is operable to actuate the moving mass 222 in a desired direction. The moving mass 222 cancels the parasitic forces, such as vibrations and other disturbances, of the digital lithography system 100 by providing a force in the opposite direction of the vibrations and other disturbances.

In one embodiment, which can be combined with other embodiments described herein, the active compensator 212 can be filtered such that active compensation will not occur, while other active compensators 212 can compensate for the parasitic forces. For example, the first active compensator 212*a* (shown in FIGS. 2A and 2B) operable to compensate in the X direction and the second active compensator 212*b* (shown in FIGS. 2A and 2B) operable to compensate in the Y direction can be filtered by the controller 122. Therefore, the third active compensator 212*c* (shown in FIGS. 2A and 2B) will compensate for the vibrations only in the Z direction. The active compensators 212 can provide a force in any desired direction while filtering out the acceleration measurements in a non-desired direction. Each active compensator 212 is in communication with the controller 122. Further, each accelerometer 220 is in communication with the controller 122 and each voice coil 224 is in communication with the controller 122.

Figure 3:
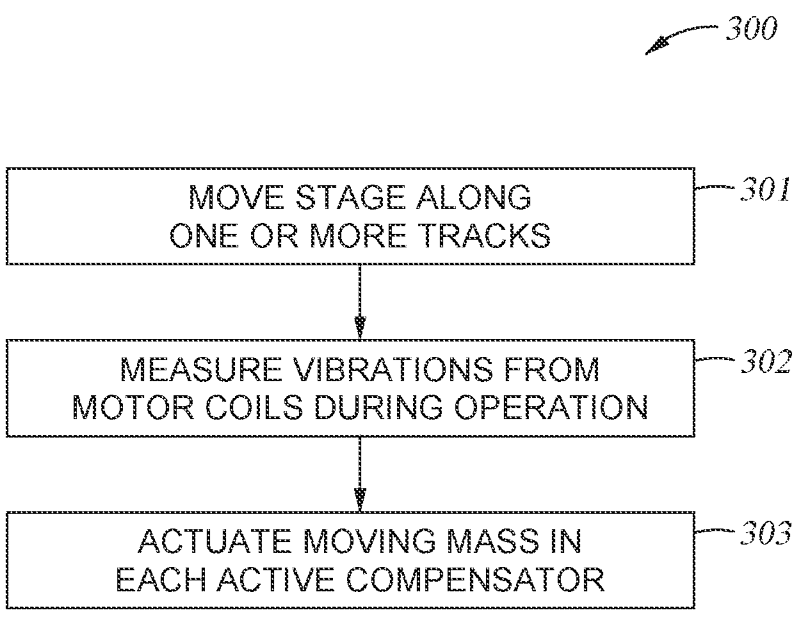
FIG. 3 is a flow diagram of a method of using a digital lithography system according to embodiments.

FIG. 3 is a flow diagram of a method 300 of using a digital lithography system 100. A controller 122 is operable to facilitate the operations of the method 300. At operation 301, a stage 114 is moved along one or more tracks 116. The stage 114 is coupled to one or more mounts 210. Each mount of the one or more mounts 210 include one or more active compensators 212. Each mount of the one or more mounts 210 is coupled to a respective motor coil 208 disposed between an upper plate 207 and a lower plate 209 of the one or more tracks 116. The upper plate 207 and the lower plate 209 include an array of magnets 202 disposed on an inner surface 203 thereof.

At operation 302, vibrations from the motor coils 208 during operation of the digital lithography system 100 are measured. The vibrations are measured with an accelerometer 218 disposed in each active compensator 212. Depending on the location of the active compensator 212, the accelerometer 220 can measure the acceleration of the motor coil 208 in the X direction, the Y direction, and the Z direction. In other embodiments, the position of the one or more motor coils 208 and the trajectory of the stage 114 are also measured. The position sensor 128 disposed along a surface of the air bearing 124 transfers the position of the one or more motor coils 208 and the stage 114 to the controller 122. The trajectory of the stage 114 from the loading position to the processing position is input to the controller 122 prior to the digital lithography operation.

At operation 303, a moving mass 222 disposed in each active compensator 212 is actuated. The moving mass 222 is actuated in a direction opposite of the vibrations from the motor coils 208. The controller 122 receives the acceleration of the one or more motor coils 208 and communicates with the voice coil 224. The voice coil 224 is operable to actuate the moving mass 222 in a desired direction. The controller 122 may also receive the position of the one or more motor coils 208, and the trajectory of the stage 114, and communicates with the voice coil 224. The moving mass 222 cancels the parasitic forces, such as vibrations and other disturbances, of the digital lithography system 100 by providing a force in the opposite direction of the vibrations and other disturbances.

In summation, embodiments of the present disclosure relate to a digital lithography system that compensates for vibrations during a digital lithography operation. The digital lithography system includes one or more motor coils disposed between an upper plate and a lower plate of a yoke of at least one track. The motor coils are each coupled to a mount which is coupled to a stage. Each mount includes one or more active compensators. During a digital lithography operation, the active compensators are in communication with the controller. The active compensators provides a force in the opposite direction of the parasitic forces, such as vibrations and other disturbances. The compensation of the vibrations and other disturbances increases the quality of the patterns printed by the digital lithography system.

While the foregoing is directed to examples of the present disclosure, other and further examples of the disclosure may be devised without departing from the basic scope thereof, and the scope thereof is determined by the claims that follow.

What is claimed is:

1. A digital lithography system, comprising:
- one or more tracks disposed on a slab, each of the one or more tracks having a yoke including:
  - a lower plate coupled to the slab; and
  - an upper plate;
- one or more motor coils, each of the motor coils disposed between the lower plate and the upper plate;
- one or more mounts having one or more active compensators of vibrations during operation of the digital lithography system, each of the one or more mounts coupled to a respective motor coil of the one or more motor coils and the one or more active compensators comprise one or more first active compensators configured to compensate vibration in a first direction, one or more second active compensators configured to compensate vibration in a second direction, and one or more third active compensators configured to compensate vibration in a third direction, wherein the first, second, and third directions are perpendicular to one another; and
- a stage coupled to each of the one or more mounts, the stage comprising a pair of protrusions that are disposed adjacent to an air bearing disposed on the slab, the air bearing positioned under the stage with each protrusion of the pair of protrusions being disposed on opposite sides of the air bearing.

2. The digital lithography system of claim 1, further comprising a position sensor disposed on the air bearing, the position sensor operable to measure the position of the stage and the one or more motor coils.

3. The digital lithography system of claim 2, further comprising a controller in communication with the position sensor.

4. The digital lithography system of claim 1, wherein each of the one or more active compensators include:
- an accelerometer;
- a moving mass; and
- a voice coil.

5. The digital lithography system of claim 1, further comprising a controller in communication with each of the one or more active compensators.

6. The digital lithography system of claim 1, further comprising a base accelerometer, the base accelerometer in communication with a controller.

7. The digital lithography system of claim 1, wherein the stage is configured to support a substrate.

8. The digital lithography system of claim 1, wherein the stage is configured to move along the one or more tracks.

9. The digital lithography system of claim 1, further comprising a processing apparatus, the processing apparatus having:
- a support coupled to the slab, the support having an opening for the stage to pass thereunder; and
- a plurality of image projection systems disposed above the stage.

10. The digital lithography system of claim 1, wherein the stage is operable to step or scan in a digital lithography operation.

11. The digital lithography system of claim 1, wherein each of the lower plate and upper plate have an inner surface having an array of magnets coupled thereto.

12. A digital lithography system, comprising:
- a slab;
- a stage disposed over the slab, the stage configured to support a substrate, the stage comprising a pair of protrusions that are disposed adjacent to an air bearing disposed on the slab, the air bearing positioned under the stage with each protrusion of the pair of protrusions being disposed on opposite sides of the air bearing;
- one or more tracks disposed on the slab, the stage configured to move along the one or more tracks, each of the one or more tracks having a yoke including:
  - a lower plate coupled to the slab; and
  - an upper plate;
- one or more motor coils, each of the motor coils disposed between the lower plate and the upper plate; and
- one or more mounts having one or more active compensators of vibrations during operation of the digital lithography system, each of the one or more mounts coupled to a respective motor coil of the one or more motor coils, the stage coupled to each of the one or more mounts, and the one or more active compensators comprise one or more first active compensators configured to compensate vibration in a first direction, one or more second active compensators configured to compensate vibration in a second direction, and one or more third active compensators configured to compensate vibration in a third direction, wherein the first, second, and third directions are perpendicular to one another.

13. The digital lithography system of claim 12, further comprising a position sensor disposed on the air bearing, the position sensor operable to measure the position of the stage and the one or more motor coils.

14. The digital lithography system of claim 12, wherein each of the lower plate and upper plate have an inner surface having an array of magnets coupled thereto.

15. The digital lithography system of claim 12, wherein each of the one or more active compensators include:
- an accelerometer;
- a moving mass; and
- a voice coil.

16. A method of using a digital lithography system, comprising:

moving a stage along one or more tracks disposed on a slab, the stage coupled to one or more mounts and comprising a pair of protrusions that are disposed adjacent to an air bearing disposed on the slab, the air bearing positioned under the stage with each protrusion of the pair of protrusions being disposed on opposite sides of the air bearing, each mount of the one or more mounts having one or more active compensators, each mount of the one or more mounts coupled to a respective motor coil of one or more motor coils disposed between an upper plate and a lower plate of the one or more tracks, the upper plate and the lower plate having an array of magnets disposed on an inner surface thereof, and the one or more active compensators comprising one or more first active compensators configured to compensate vibration in a first direction, one or more second active compensators configured to compensate vibration in a second direction, and one or more third active compensators configured to compensate vibration in a third direction, wherein the first, second, and third directions are perpendicular to one another;

measuring vibrations from the motor coils during operation of the digital lithography system with an accelerometer disposed in each active compensator of the one or more active compensators; and actuating a moving mass disposed in each active compensator of the one or more active compensators in a direction opposite of the vibrations from the motor coils.

17. The method of using a digital lithography system of claim 16, wherein the stage is disposed beneath a processing apparatus, the processing apparatus having:

a support coupled to the slab, the support having an opening for the stage to pass thereunder; and a plurality of image projection systems disposed above the stage.

* * * * *